United States Patent [19]
Idaka et al.

[11] Patent Number: 4,801,822
[45] Date of Patent: Jan. 31, 1989

[54] SEMICONDUCTOR SWITCHING CIRCUIT

[75] Inventors: Yukio Idaka, Nara; Shuichiroh Yamaguchi, Hirakata; Takeshi Matsumoto, Shijonawate, all of Japan

[73] Assignee: Matsushita Electric Works, Ltd., Osaka, Japan

[21] Appl. No.: 78,791

[22] Filed: Jul. 28, 1987

[30] Foreign Application Priority Data

Aug. 11, 1986 [JP] Japan .................................. 61-188272
Oct. 27, 1986 [JP] Japan .................................. 61-255023

[51] Int. Cl.$^4$ ............................................ G02B 27/00
[52] U.S. Cl. ...................................... 307/311; 307/570; 250/551
[58] Field of Search ............... 307/311, 300, 570, 565; 250/551

[56] References Cited

U.S. PATENT DOCUMENTS 3,299,297  1/1967  Motto, Jr. ............................. 307/595
4,227,098 10/1980  Brown et al. ........................ 250/551
4,303,831 12/1981  El Hamamsy ...................... 250/551
4,390,790  6/1983  Rodriguez ............................ 250/551
4,419,586 12/1983  Phipps .................................. 250/551
4,492,883  1/1985  Janutka ................................ 307/570
4,665,316  5/1987  Hodges ................................ 250/551

Primary Examiner—Stanley D. Miller
Assistant Examiner—Nancy P. Thai
Attorney, Agent, or Firm—Burns, Doane, Swecker & Mathis

[57] ABSTRACT

A semiconductor switching circuit comprises an output FET receiving a photovoltaic output generated by a diode array responsive to a light signal from a light emitting element, a depression mode driving FET connected at the drain and source to the gate and source of the output FET, and a constant voltage conduction element connected in parallel with a resistor connected across the gate and source of the driving FET. The sensitivity of the circuit is elevated by setting the value of this resistor relatively high, whereas high speed operation can be assured by having discharge current of an accumulated charge across the drain and gate of the output FET bypassed through the resistor.

4 Claims, 2 Drawing Sheets

SEMICONDUCTOR SWITCHING CIRCUIT

TECHNICAL BACKGROUND OF INVENTION

This invention relates to semiconductor switching circuits and, more particularly, to a semiconductor switching circuit which converts a light signal into an electrical signal by means of a photovoltaic diode array optically coupled to such light emitting element as a light emitting diode which converts an input signal into the light signal, the converted electrical signal being utilized for driving such output means as FET, preferably a metal-oxide-semiconductor field effect transistor (which shall be hereinafter referred to simply as "MOSFET").

DISCLOSURE OF PRIOR ART

For the semiconductor switching circuit of the kind referred to, there has been proposed in U.S. Pat. No. 4,227,098 to Dale M. Brown et al such a circuit in which a photovoltaic diode array is optically coupled to a light emitting diode and electrically connected in parallel with a resistor which providing to the array a resistive impedance and in series with gate and source electrodes of the MOSFET.

When a current flows across input terminals on the light emitting diode side in this case, a photovoltaic output is generated across both end terminals of the photovoltaic diode array, a voltage of which output is applied across the gate and source of the MOSFET, and consequent thereto the impedance of the MOSFET between output terminals connected to current passage electrodes of the MOSFET is remarkably changed to a different value, that is, in the case of MOSFET of enhancement mode, the state across the output terminals is shifted from OFF state to ON state. At this time, the resistor connected in parallel to the diode array serves to discharge electrostatic charge accumulated across the gate and source electrodes of the MOSFET and, provided that this resistor is not present, the state across the output terminals cannot be returned to the OFF state even when the input current to the light emitting diode is interrupted.

In the above U.S. Patent, there have been such problems that, while it is necessary to render the value of the resistor large in order to reduce the required minimum input current for achieving ON state across the output terminals, the resistance value must be small in order to shorten the required time for turning the state across the output terminals to OFF after the interruption of the input current, so that it has been difficult to concurrently achieve these two antinomic functions; and that, when the input current is in the minimum current range, the voltage across the gate and source of the MOSFET varies proportionally to the input current so that the impedance of the MOSFET across the output terminals connected to the current passing electrodes of the MOSFET may take a value which causes the state across the terminals to be intermediate between the ON and OFF states so as to cause a large power loss to occur and the elements damaged.

Further, U.S. Pat. No. 4,390,790 to Edward T. Rodriguez discloses a semiconductor switching circuit in which a photovoltaic diode array optically coupled to a light emitting diode is connected in series with a MOSFET to the gate and source of which a normally ON type junction FET is connected, and an additional photovoltaic diode array is connected across the gate and source of this junction FET through a resistor. According to Rodriguez, the intermediate state of the MOSFET can be prevented by the provision of the additional diode array for driving the normally ON type junction FET, but the circuit arrangement of combining the junction FET with the additional diode array causes another problem to arise in that required chip size for the diode array is enlarged and the optical conduction coefficient is deteriorated to lower the photosensitivity and switching operation.

In U.S. Pat. No. 4,492,883 to William J. Janutka, further, there is disclosed a turning-OFF circuit for the MOSFET, in which another P-channel type FET is connected between the gate and the source of the MOSFET, a Zener diode is inserted between the gate and the source of this another FET, i.e., between the gate of the MOSFET and the gate of the P-channel FET, and a resistor is inserted between the gate and the drain of the P-channel FET. With this circuit arrangement, too, the switching operation of MOSFET can be prevented. Because of the use, however, of a leak of gate driving due to the resistor employed, it becomes necessary for the high speed turning ON operation to use a high-voltage and high-current driving power source, which rendering the circuit to be disadvantageous in coupling to the photovoltaic diode array.

Further, in U.S. patent application Ser. No. 26,994 (or its corresponding German application No. P 37 08 812.2, U.K. application No. 87 05701 or Korean application No. 87-2703) of Sigeo Akiyama, assigned to the same assignee as in the present case, there has been suggested a semiconductor switching circuit wherein a MOSFET is connected in series with a photovoltaic diode array optically coupled to a light emitting diode, an impedance element is connected in series with the photovoltaic diode array, and a normally ON type driving transistor is connected to the MOSFET as connected at the control electrode to a junction point between the photovoltaic diode array and the impedance element so as to be biased into a high impedance state by means of a voltage generated across the impedance element due to a photovoltaic output of the photovoltaic diode array. In this case, it is made possible to prevent the occurrence of an intermediate state between the ON and OFF states across output terminals within the minimum required input current range for achieving ON state across the output terminals, and the operating speed can be accelerated to a large extent as compared with the ON and OFF speed in the respective known semiconductor switching circuits of the foregoing three U.S. Patents.

In the case of this semiconductor switching circuit of Akiyama, the various problems involved in the known circuits can be effectively eliminated, but it is still desired to improve the input sensitivity and to shorten the response time as well for achieving a still higher speed switching operation, because the impedance element such as the resistor which is contributive to the biasing of the normally ON type driving transistor into the high impedance state and set to be large in the value may render the required minimum current, i.e., working current for turning the state across the output terminals to be ON can be made smaller but the required response time for having the output terminal state reached the OFF state to be rather prolonged, while the value set smaller should result in opposite phenomenon, though the circuit shows much more improvements than in the case of the foregoing patents in these respects of conditions.

FIELD OF TECHNOLOGY

It is the object of the present invention to provide a semiconductor switching circuit which is remarkably improved in the sensitivity and operating speed to be higher, in addition to such effect achieved in the circuit of Akiyama as the prevention of the instantaneous mistriggering by preventing that the state across the output terminals is left to be intermediate between the ON and OFF states within the range of the input current nearby the operating current.

According to the present invention, the above object can be attained by a semiconductor switching circuit comprising a diode array optically coupled to a light emitting element which generates a light signal in the presence of an input current for generating a photovoltaic output in response to the light signal, a resistor connected in series with the photovoltaic diode array, an output FET connected to the photovoltaic diode array to be turned from a first impedance state to a second impedance state upon application of the photovoltaic output across the gate and source of the output FET, and a depression mode driving FET capable of being biased into OFF state by a voltage across the resistor upon generation of the photovoltaic output at the diode array and connected at the drain and source to the gate and source of the output FET and at the gate and source across the resistor, wherein a constant-voltage conduction element which is conductive under an application of a voltage higher than a threshold voltage of the depression mode output FET and charges between the gate and the source while discharging between the drain and the gate of the output FET with a current upon the conduction is connected in parallel with the resistor which is connected across the gate and source of the driving FET.

In the above semiconductor switching circuit according to the present invention, the sensitivity can be elevated by setting the value of the resistor connected between the gate and the source of the driving FET, so that the driving FET can be shifted to OFF state even with a slight input current, and eventually the gate potential of the output FET can be elevated with a slight optical current to shift the output FET from OFF state to ON state. During transient period of this shift from the OFF state to the ON state of the output FET, on the other hand, a charge accumulated across the drain and gate of the output FET is discharged, upon which the constant-voltage conduction element is made conductive by a voltage generated at both ends of a parallel circuit of the resistor and constant-voltage conduction element so that the element will be bypassed for maintaining discharge current dependent on the capacity between the drain and the gate of the output FET to be at a high level, and a high speed shift from OFF state to ON state of the output FET can be thereby assured.

Other objects and advantages of the present invention shall be made clear in the following disclosure detailed with reference to embodiments of the invention as shown in accompanying drawings.

While the invention shall be explained with reference to the embodiments shown in the accompanying drawings, it should be appreciated that the intention is not to limit the invention to these embodiments but rather to cover all various design modifications possible within the scope of appended claims.

DISCLOSURE OF PREFERRED EMBODIMENTS

Figure 1:
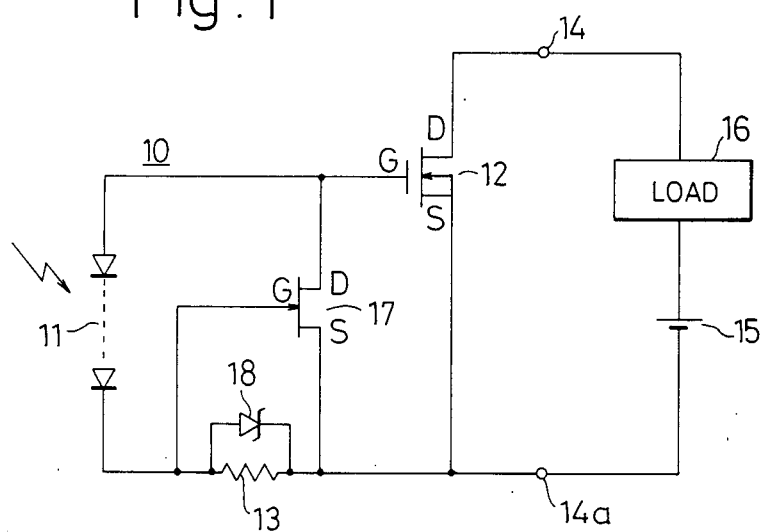
FIG. 1 shows a circuit diagram in an embodiment of the semiconductor switching circuit according to the present invention in which a Zener diode is employed as the constant-voltage conduction element.

Referring to FIG. 1 showing an embodiment of the semiconductor switching circuit of the present invention, the circuit 10 includes a diode array 11 optically coupled to such a light emitting element as a light emitting diode which generates a light signal in response to an input current signal, and the diode array 11 generates a photovoltaic output upon receipt of the light signal from the light emitting element. The diode array 11 is connected between the gate and the source of an output FET, preferably a MOSFET 12 with a resistor 13 of a relatively large value and connected in series with the array. The output MOSFET 12 is preferably of an N-channel type of enhancement mode, and functions to turn from a first impedance state to a second impedance state with an application of the photovoltaic output from the diode array 11 across the gate and source, while the output MOSFET 12 is connected at the drain and source through a pair of output terminals 14 and 14a to a series circuit of a power source 15 and load 16 so as to be at positive potential on the drain side with respect to the source side, for controlling the load 16 in accordance with the impedance state of the output MOSFET 12.

Across the gate and source of the output MOSFET 12, on the other hand, a driving FET 17 of a depletion mode is connected at the drain and source thereof, while this driving FET 17 is connected at the gate and source across the resistor 13 connected in series to the diode array 11. For the driving FET 17, preferably, a junction type FET (JFET) is employed so as to be biased into OFF state by a voltage across the resistor 13 upon the generation of the photovoltaic output at the diode array 11 responsive to the light signal.

To the resistor 13, further, a Zener diode 18 employed as the constant-voltage conduction element unique in the present invention is connected in parallel, and this Zener diode 18 is set to have a breakdown voltage higher than a threshold voltage of the depletion mode driving FET 17. Further, the Zener diode 18 is inserted in the circuit 10 to be conductive with an applied voltage higher than the threshold voltage of the driving FET 17 and to be of a polarity in which a Zener current upon such conduction performs a charge across the gate and source of the output MOSFET 12.

The operation of the present embodiment shall be explained next. Referring first to the operation in a state where the Zener diode 18 is absent for acceleration of the understanding of the present invention, a reception of the light signal at the photovoltaic diode array 11 causes a photovoltaic voltage generated across the diode array 11, and an optical current flows through the circuit 10. This current flows, through the driving FET 17 which is normally ON, to the resistor 13 of the relatively large resistance and, when the voltage across the resistor 13 exceeds the threshold voltage of the driving FET 17, the latter turns to OFF state, upon which the optical current flows to charge across the gate and source of the output MOSFET 12 to elevate its gate potential, and the output MOSFET 12 shifts from OFF state to ON state. During the transient period of this shift, the drain potential of the MOSFET 12 drops from the source voltage level to zero level, so that the potential difference between the drain and the gate of the MOSFET 12 also largely varies, and it becomes necessary to discharge a charge accumulated between the drain and the gate through the photovoltaic diode array 11. The time required for this discharge is to occupy the most part of the operation time of the entire circuit 10, or in other words, the response time.

Figure 2:
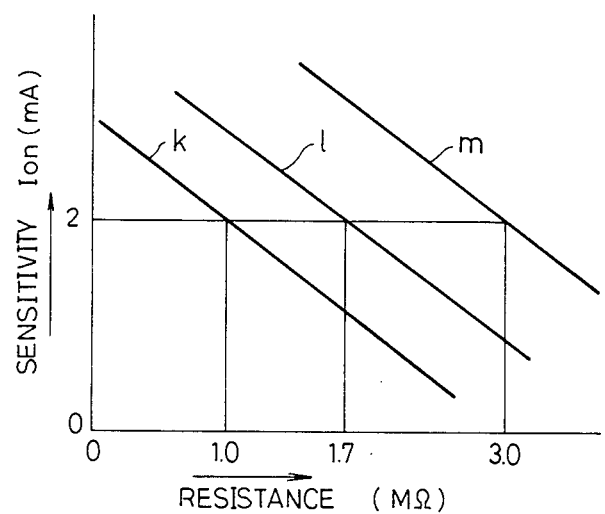
FIG. 2 is a diagram showing the relationship between the input current for shifting the output MOSFET from OFF state to ON state, that is, the sensitivity, and the resistance.
Figure 3:
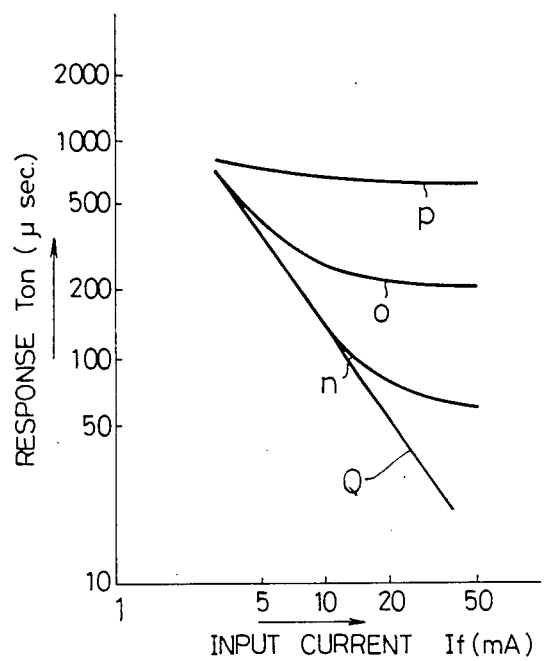
FIG. 3 is a diagram showing the relationship between the response speed of the semiconductor switching circuit in the absence of the constant-voltage conduction element and the input current.

In the present instance, the minimum required input current or, in other words, working current for turning the state between the output terminals 14 and 14a of the MOSFET 12 to be ON is gradually decreased as will be clear when FIG. 2 is referred to, as the value of the resistor 13 connected between the gate and the source of the driving FET is increased. That is, in FIG. 2, curves k, 1 and m represent respective cases where the across gate-and-source voltage of the driving FET 17 set to be $-0.3$ V, $-0.5$ V and $-0.9$ V, respectively, in which the working current $I_{on}$ is decreased as the resistance of the resistor 13 is increased so that the working current can be about 2 mA with the resistance of 1.0 M$\Omega$ at the across gate-and-source voltage of $-0.3$ V, 1.7 M$\Omega$ at $-0.5$ V and 3.0 M$\Omega$ at $-0.9$ V. Even when the value of the resistor 13 is merely increased higher to increase the light amount to the diode array 11, i.e., the input current $I_f$ to the light emitting element optically coupled to the diode array 11, on the other hand, the operation time of the entire circuit 10 or, in other words, the response time $T_{on}$ shows no substantial change as will be clear when FIG. 3 is referred to, and the high speed operation can hardly be realized. That is, in FIG. 3, curves n, o and p represent the cases where the resistance of the resistor 13 is set to be 0.3 M$\Omega$, 1 M$\Omega$ and 3 M$\Omega$ and, in an event where the resistor 13 is made to be of, for example, more than 3 M$\Omega$, the response time $T_{on}$ cannot be less than 600 $\mu$sec. even when the input current $I_f$ has reached above 50 mA, due to that the optical current upon the discharge of the charge accumulated between the drain and the gate of the MOSFET 12 is remarkably restricted by the resistor 13.

In the present embodiment of the invention, there is connected the Zener diode 18 in parallel with the resistor 13 so that, even when the resistor 13 of a large value is used, the voltage applied across the parallel circuit of the resistor 13 and Zener diode 18 is caused to exceed the breakdown voltage of the Zener diode 18 upon the discharge of the charge across the gate and drain of the output MOSFET 12 in the transient period from the OFF state to the ON state of the MOSFET 12 as has been referred to, the Zener diode 18 is thereby turned to be conductive so as to perform a bypass function, and the discharge current is made to flow mainly through the Zener diode 18. The discharge time for the charge accumulated across the gate and drain of the MOSFET 12 can be sufficiently shortened, showing such characteristics as represented by a curve q which is linear in FIG. 3, and a high speed operation to the ON state of the output MOSFET 12 can be assured even when the value of the resistor 13 is made high and the working current is set to be small.

In an event where the output MOSFET 12 completely shifts to the ON state, the discharge of the charge across the drain and gate of the MOSFET 12 terminates while a charge across the gate and source is performed to raise the voltage thereacross, the voltage across the parallel circuit of the resistor 13 and Zener diode 18 drops, the voltage drop at the resistor 13 becomes small to be below the breakdown voltage of the Zener diode 18, and then the Zener diode 18 turns to be in non-conductive state. Thereafter, a slight current flows across the drain and source of the driving FET 17 and, due to the presence of the resistor 13, the driving FET 17 can be maintained at the high impedance state.

When, on the other hand, the input current to the light emitting element optically coupled to the photovoltaic diode array 11 disappears and thus the array 11 no larger receives the light signal, the generation of the photovoltaic output at the diode array 11 is interrupted and the voltage across the gate and source of the driving FET 17 drops. The driving FET 17 is thereby turned to be ON state, and the charge accumulated across the gate and source of the output MOSFET 12 is quickly discharged through the driving FET 17, so that the output MOSFET 12 is made to be OFF state and an OFF state is also achieved across the output terminals 14 and 14a. While the charge accumulated across the gate and source of the driving FET 17 is to be discharged through the resistor 13, the capacitance across the electrodes of the driving FET is much smaller than that across the electrodes of the output MOSFET 12, and the time required for discharging this charge is short, so that the discharge is not effective to give any substantial influence upon the high speed operation of the output MOSFET 12.

Figure 4:
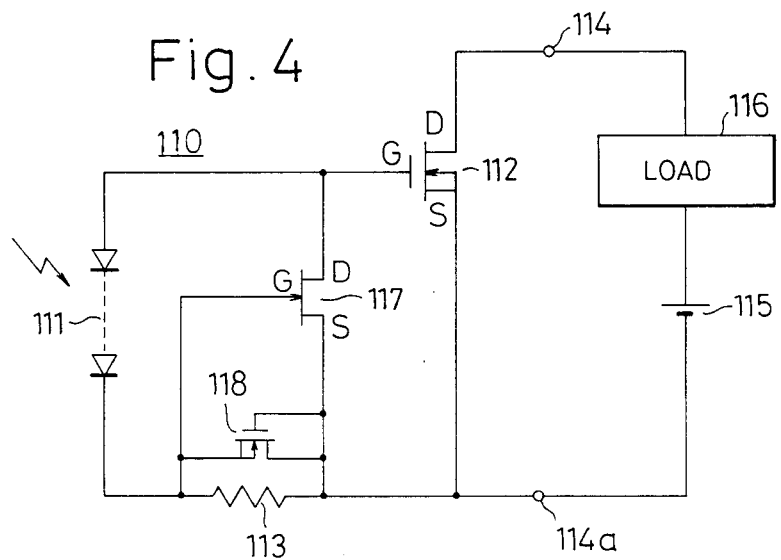
FIG. 4 is a circuit diagram in another embodiment of the semiconductor switching circuit according to the present invention in which an enhancement mode FET is employed as the constant-voltage conduction element.

Referring now to FIG. 4, there is shown another embodiment of the semiconductor switching circuit according to the present invention, in which the same circuit constituents as in the embodiment of FIG. 1 are denoted by the same reference numerals as in FIG. 1 but added by 100. The present embodiment is different from that of FIG. 1 only in the use, as the constant-voltage conduction element to be connected in parallel with the resistor 113, of an enhancement mode FET 118 short-circuited across the gate and drain. This enhancement mode FET 118 is provided with a threshold voltage higher than that of the driving FET 117, and is connected to be parallel to the resistor 113 and across the gate and source of the driving FET 117, so as to be of such polarity that a charge across the gate and source of the output MOSFET 112 is achieved with the drain current upon the conduction. As the voltage applied across the both ends of the parallel circuit of the resistor 113 and enhancement mode FET 118 rises to be above a predetermined threshold voltage across the drain and source of the FET 118, then a conduction state is achieved across the drain and source of the FET but, because of the short-circuit across the gate and drain, the enhancement mode FET 118 can perform substantially the same function as the Zener diode 18 in the embodiment of FIG. 1. In the case of this embodiment, the enhancement mode FET 118 has a similar structure as the MOSFET 112 and driving FET 117, so as to be particularly advantageous when the semiconductor switching circuit 110 is formed by means of a lamination into a single chip, and to be improved in the mass producibility.

In the semiconductor switching circuit 110 in the embodiment of FIG. 4, other arrangement and operation are substantially the same as those in the embodiment of FIG. 1.

In the present invention, a variety of design modifications can be made within the scope of the appended claims. For example, while the MOSFET has been disclosed to be used as the output FET, a static induction type transistor (SIT) or the like may be also utilized. Instead of the junction type FET (JFET) shown to be used as the depression mode driving FET 17 or 117, a depression mode MOSFET or a static induction type transistor (SIT) may also be employed. Further, the enhancement mode N-channel type has been disclosed as being used as the output MOSFET 12 or 112, but it may also be possible to employ one of P-channel type or depression mode.

According to the semiconductor switching circuit of the present invention having such arrangement as has been described, the ON and OFF operation of the output FET can be realized with a slight input current, so that the circuit can be effectively improved in sensitivity, and the charge across the gate and drain of the output FET can be quickly discharged in the transient period of the shift of the output FET into the ON state, whereby high speed operation can be assured so that the functions which have been mutually antinomic in the semiconductor switching circuits of the kind referred to can be made simultaneously achievable.

We claim as our invention:

1. A semiconductor switching circuit comprising a diode array optically coupled to a light emitting element which generates a light signal in the presence of an input current for generating a photovoltaic output responsive to said light signal, a resistor connected in series with said photovoltaic diode array, an output FET having a gate, a source and a drain, said output FET being connected to said photovoltaic diode array to be turned from a first impedance state to a second impedance state upon application of said photovoltaic output to the gate and source, a depletion-mode driving FET having a gate, a source and a drain, said driving FET being connected at the drain and source to the gate and source of said output FET and at the gate and source to both ends of said resistor and capable of being biased into an OFF state by a voltage across the resistor upon generation of said photovoltaic output at the photovoltaic diode array, and a constant-voltage conduction element connected in parallel with said resistor to be conductive upon application of a voltage higher than a threshold voltage of said depletion mode driving FET and contributive, with a conduction current upon said conduction, to a charge between the gate and the source and to a discharge between the drain and the gate of the output FET.

2. A semiconductor switching circuit according to claim 1, wherein said constant-voltage conduction element is a Zener diode having a breakdown voltage higher than said threshold voltage of said driving FET.

3. A semiconductor switching circuit according to claim 1, wherein said constant-voltage conduction element is an enhancement mode FET having a threshold voltage higher than that of said driving FET and short-circuited across the gate and drain.

4. A semiconductor switching circuit according to claim 1, wherein said output FET is a MOSFET.

* * * * *